United States Patent [19]
Lim et al.

[11] Patent Number: 5,635,937
[45] Date of Patent: Jun. 3, 1997

[54] PIPELINED MULTI-STAGE ANALOG-TO-DIGITAL CONVERTER

[75] Inventors: Shin-Il Lim; Seoung-Hoon Lee, both of Seoul, Rep. of Korea

[73] Assignee: Korea Academy of Industrial Technology, Seoul, Rep. of Korea

[21] Appl. No.: 366,563

[22] Filed: Dec. 30, 1994

[30] Foreign Application Priority Data

Dec. 31, 1993 [KR] Rep. of Korea ............... 32125/1993

[51] Int. Cl.$^6$ ............................................. H03M 1/38
[52] U.S. Cl. ...................... 341/161; 341/118; 341/120
[58] Field of Search ............................. 341/161, 118, 341/120

[56] References Cited

U.S. PATENT DOCUMENTS

| | | |
|---|---|---|
| 4,200,863 | 4/1980 | Hodges et al. . |
| 4,326,192 | 4/1982 | Merrill et al. ............... 340/347 AD |
| 4,342,983 | 8/1982 | Weigand et al. ............... 340/347 CC |
| 4,399,426 | 8/1983 | Tan . |
| 4,745,394 | 5/1988 | Cornett . |
| 4,894,656 | 1/1990 | Hwang et al. . |
| 4,894,657 | 1/1990 | Hwang et al. . |
| 4,903,026 | 2/1990 | Tiemann et al. . |
| 4,908,621 | 3/1990 | Polonio et al. . |
| 5,043,732 | 8/1991 | Robertson et al. . |
| 5,047,772 | 9/1991 | Ribner ............... 341/156 |
| 5,235,335 | 8/1993 | Hester et al. . |
| 5,274,377 | 12/1993 | Matsuura et al. . |
| 5,416,485 | 5/1995 | Lee ............... 341/172 |
| 5,499,027 | 3/1996 | Karanicolas et al. ............... 341/120 |
| 5,510,789 | 4/1996 | Lee ............... 341/120 |

*Primary Examiner*—Jeffrey A. Gaffin
*Assistant Examiner*—Jason L. W. Kost
*Attorney, Agent, or Firm*—Robert E. Bushnell, Esq.

[57] ABSTRACT

A pipelined multi-stage analog-to-digital converter (ADC) exhibits high speed and high resolution characteristics in a small chip area using a CMOS process. An optimized high resolution multi-stage ADC improves integral non-linearity errors (INL) and differential non-linearity (DNL) errors and hence increases yield. A binary-weighted capacitor array is used in a multiplying digital-to-analog converter (MDAC) in a front-end stage, and a unit capacitor array is used in the MDACs of the latter stages thereof. Offset, feedthrough and gain errors are removed via digital correction. A digital calibration technique is adopted to reduce the non-ideal effects resulting from component mismatch, by measuring all the code errors of the front-end stage, to thereby minimize the midpoint code DNL error without reference to code symmetry.

27 Claims, 10 Drawing Sheets

PIPELINED MULTI-STAGE ANALOG-TO-DIGITAL CONVERTER

CROSS-REFERENCE TO RELATED APPLICATIONS

This application makes reference to, incorporates the same herein, and claims all benefits incurring under 35 USC §119 from an application for Pipelined Multi-Stage Analog-to-Digital Converter on 31 Dec. 1993 and assigned Ser. No. 1993/32125.

BACKGROUND OF THE INVENTION

1. Technical Field

The present invention relates to an analog-to-digital converter (ADC), and more particularly, to a pipelined multi-stage ADC having an improved linearity and yield by using the proper combination of a binary-weighted capacitor (BWC) array and a unit capacitor (UC) array.

2. Background Art

Modern advanced electronic circuitry such as employed in a scanner, a high-definition television, a camcorder, a medical image processor and a radar system require availability of high resolution, high accuracy, excellent linearity, and high speed ADCs. Since a monolithic integrated circuit consumes relatively low power and occupies small area, a pipelined multi-stage ADC has been widely used for high speed analog-to-digital conversion. Examples of these types of ADCs are described, for example, in "A Fully Parallel 10-Bit A/D Converter With Video Speed" by Toyoki Takemoto et al., *IEEE Journal of Solid State Circuits*, vol. SC-17, no. 6, pp. 1133 to 1138 (December 1982), "An 8-MHz CMOS Subarranging 8-Bit A/D Converter" by Andrew G. F. Dingwall et al., *IEEE Journal of Solid-Stage Circuits*, vol. SC-20, no. 6, pp. 1138 to 1143 (December 1985), and "A Pipelined 5-Msample/s 9-bit Analog-to-digital Converter" by Stephen H. Lewis et al., *IEEE Journal of Solid-Stage Circuits*, vol. SC-22, no. 6, pp. 954 to 961 (December 1987). The parallel architectures require a large number of comparators, making their use for higher resolution impractical. The multistage conversion architectures reduce the total number of comparators significantly, resulting in a smaller chip area and lower power dissipation.

Conventional pipelined ADCs are disclosed in U.S. Pat. No. 4,745,394 for Pipeline A/D Converter issued to Cornett, and in U.S. Pat. No. 5,274,377 for Pipeline A/D Converter issued to Matsuura et al. In these conventional pipelined ADCs, a plurality of stages is employed wherein each stage initially samples and holds the output signal of the preceding stage and then performs a low resolution A/D conversion using a flash A/D converter on the held signal. The digital code produced is converted back to an analog signal by a digital-to-analog (D/A) converter and subtracted from the held signal to produce a residue that is amplified and passed to the next stage. Although this pipelined architecture offers an advantage of low hardware cost, it, however, suffers limited processing speed and accuracy.

Other conventional pipelined ADC designs having high processing speed are disclosed in U.S. Pat. No. 4,903,026 for Architecture For High Sampling Rate, High Resolution Analog-To-Digital Converter issued to Tiemann et al., and in U.S. Pat. No. 4,894,657 for Pipelined Analog-To-Digital Architecture With Parallel-Autozero Analog Signal Processing issued to Hwang et al., and in U.S. Pat. No. 5,403,732 for Analog-To-Digital Converter Employing A Pipeline Multi-Stage Architecture issued to Robertson. Generally, in these high speed multi-stage pipelined ADCs, high speed and low resolution flash ADC is used in each stage. The use of the low resolution flash ADC in the pipelined architecture although reduces the number of capacitors, however, consumes high power and requires high input capacitance, and consequently is limited to applications of less than ten-bit resolution. Moreover, each stage of the pipelined ADCs requires a sample-and-hold circuit to perform the analog-to-digital conversion, which consequently increases the power consumption.

Also, the actual ADC has various error factors since the characteristics of the circuit elements and the matching characteristics between the circuit elements are not perfect. Such error factors are embodied as an offset error, a gain error, an integral non-linearity (INL) error, and a differential non-linearity (DNL) error. Offset error represents a deviation degree of a predetermined amount from an ideal transfer characteristic of the ADC. The gain error represents the difference between the slopes of the actual code characteristic and the ideal code characteristic. The integral non-linearity (INL) error represents the change of the transfer characteristic from a linear characteristic to a curve characteristic; that is, the transfer characteristic is not an ideal linear function. The differential non-linearity (DNL) error, on the other hand, represents the irregularity of the adjacent output value. Among the these errors, the DNL error can be checked by measuring the difference of the distance between adjacent codes. If the INL error, however, becomes large, missing code is generated in the analog-to-digital conversion.

To improve the linearity of the pipelined multi-stage ADCs to beyond the ten-bit resolution and other error factors, digital domain code error calibration technique has been developed and introduced in U.S. Pat. No. 4,894,656 for Self-Calibrating Pipelined Subranging Analog-To-Digital Converter Processing and in U.S. Pat. No. 4,894,657 for Pipelined Analog-To-Digital Architecture With Parallel-Autozero Analog Signal Processing, both issued to Hwang et al. Similarly, in U.S. Pat. No. 4,908,621 for Autocalibrated Multistage A/D Converter issued to Polordo et al. calibrates each stage of the pipelined multi-stage ADCs to maintain proper error correction levels during operation of the converter to minimize quantization errors due to component aging, temperature and other environmental effects. In these calibration techniques, although mismatched segment errors such as offset error and gain error are measured and corrected, the resulting ADC linearity is still affected.

Another recent calibration techniques are disclosed in "Digital-Domain Calibration of Multistep Analog-to-Digital Converters," *IEEE Journal Solid-state Circuits*, pp. 1679 to 1688 (December 1992), and "Interstage Gain Prorated Technique for Digital-Domain Multi-Step ADC Calibration," *IEEE Transactions on Circuits and Systems*, pp. 12 to 18 (January 1994), both papers by S. H. Lee and B. S. Song. In these techniques, only $2^{n-1}$ codes with $2^{n-1}$ bytes of memory are calibrated using the principle of code symmetry. Consequently, it suffers from a truncation error-doubling effect in the midpoint transition resulting in linearity degradation. Moreover, since one-sided codes are calibrated, the characteristics of the central linearity is not sufficiently acceptable.

SUMMARY OF THE INVENTION

It is therefore, an object of the present invention to provide a pipelined multi-stage analog-to-digital converter which exhibits high speed (i.e., video rate) and high resolution (at least twelve bits).

It is also an object to provide a novel pipelined architecture for the implementation of high-speed, high-resolution analog-to-digital converters which can be operated on a single power supply with low power consumption in a small chip area using a general complementary metal-oxide semiconductor (CMOS) process.

It is another object to provide a novel pipelined multi-stage analog-to-digital converter having improved integral non-linear characteristics and differential non-linear characteristics as well as improving overall analog-to-digital conversion performance and yield.

It is yet another an object to provide a novel pipelined architecture for the implementation of high-speed, high-resolution analog-to-digital converters in which the truncation error-doubling effect can be eliminated.

It is further an object to provide a novel pipelined architecture for the implementation of high-speed, high-resolution analog-to-digital converters in which each stage need not require a sample-and-hold circuit so as to reduce power consumption using a general complementary metal-oxide semiconductor (CMOS) process.

These and other objects may be achieved according to the principles of the present invention with a novel pipelined multi-stage analog-to-digital converter seeks to functionally replace conventional sample-and-hold (S/H) circuit, a low resolution flash analog-to-digital (A/D) converter and a low resolution digital-to-analog (D/A) converter, a substractor and a residue amplifier forming each stage of the conventional multi-stage pipelined analog-to-digital converter with a single multiplying digital-to-analog converter (MDAC), and provides calibration and correction functions in a digital domain of the analog-to-digital conversion in order to improve performance degradation due to an offset error, a gain error and a feedthrough error.

To further accomplish these and other objects of the present invention, a novel pipelined multi-stage high-resolution CMOS analog-to-digital converter (ADC) architecture is optimized by selectively implementing the front stage MDAC of the multi-stage architecture by a binary-weighted capacitor (BWC) array, and implementing the latter stage MDAC of the multi-stage architecture by a unit capacitor (UC) array to improve both integral non-linear characteristics and differential non-linear characteristics of the pipelined multi-stage analog-to-digital converter, while maintaining a high yield. In addition, calibration is performed with respect to all digital codes in the front stage BWC-based MDAC, without using the principle of code symmetry, to thereby improve the central linear characteristics. Consequently, all non-critical errors such as offset and feedthrough errors between stages are digitally corrected using overlapped bits. The largest DNL error in the midpoint transition of the ADC is reduced. The truncation error-doubling effect of the conventional techniques can also be eliminated if all the codes ($2^n$) are calibrated in the BWC-based MDAC, so that the error doubling effect does not occur in the midpoint transition, thereby resulting in the INL improvement. The INL and DNL linearity is improved however at the expense of larger memory for storing errors from $2^{n/2}$ addresses to $2^n$ addresses, but larger memory for storing errors is not critical when considering the availability of the overall chip area and the improved ADC performance.

The present invention is more specifically described in the following paragraphs by reference to the drawings attached only by way of example.

BRIEF DESCRIPTION OF THE DRAWINGS

A more complete appreciation of this invention, and many of the attendant advantages thereof, will become more apparent as the same become better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
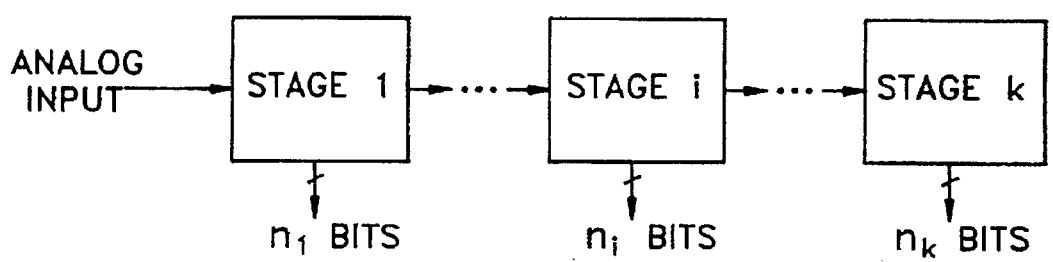
FIG. 1 is a block diagram of a conventional multi-stage pipelined ADC.
Figure 2:
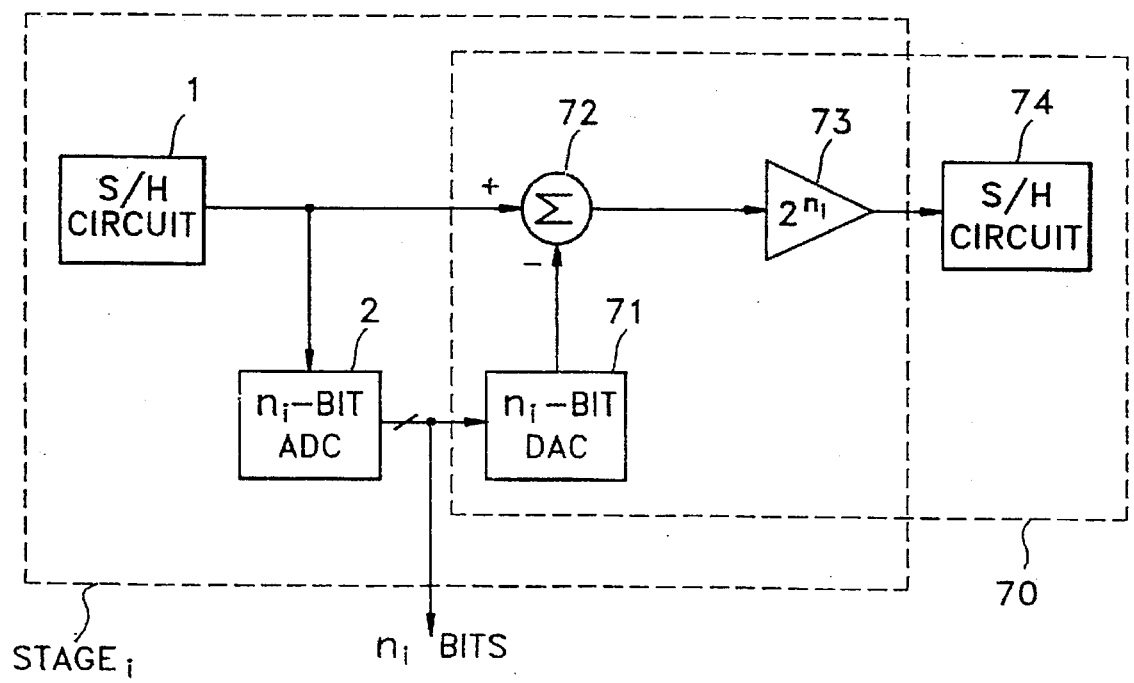
FIG. 2 is a detailed circuit diagram of each stage in the conventional multi-stage pipelined ADC shown in FIG. 1.
Figure 3:
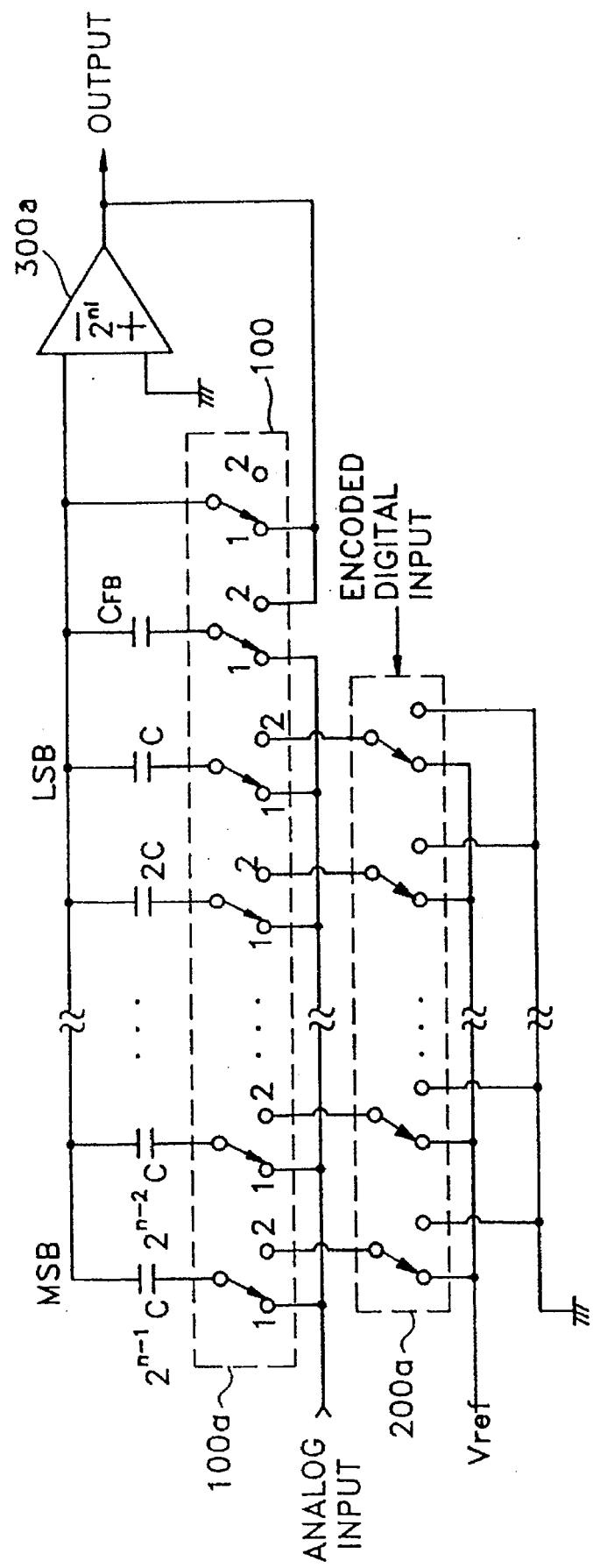
FIG. 3 is a circuit diagram of a single multiplying digital-to-analog (MDAC) converter implemented by a binary-weighted capacitor (BWC) array.
Figure 4:
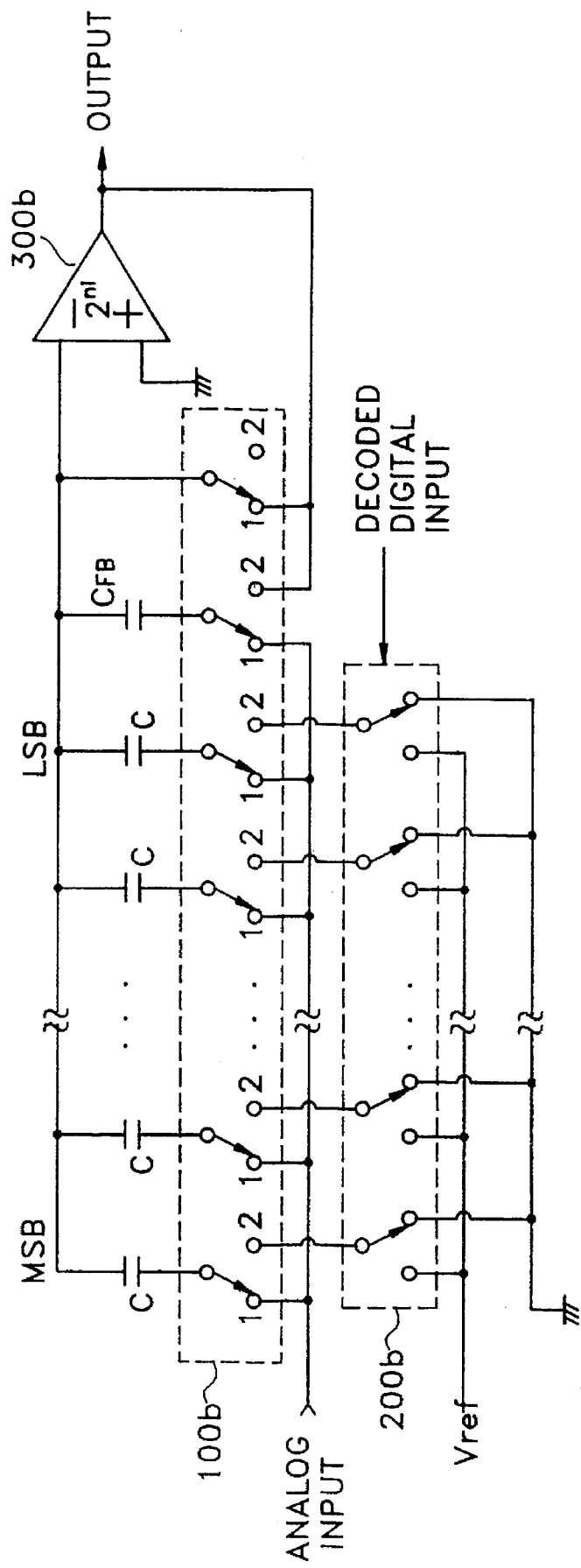
FIG. 4 is a circuit diagram of a single multiplying digital-to-analog (MDAC) converter implemented by a unit capacitor (UC) array.

Referring now to the drawings, FIG. 1 shows a block diagram of a conventional pipelined multi-stage (i.e., k-stage) ADC for converting an analog input signal into a digital output signal. Each stage is identical, and is shown in FIG. 2 to include a sample-and-hold (S/H) circuit 1, a low resolution flash ADC 2, a low resolution digital-to-analog converter (DAC) 71, a subtractor 72, and a residue amplifier (i.e., error amplifier) 73. In the implementation of each pipelined stage, I have observed that the DAC 71, subtractor 72, residue amplifier 73 and a S/H circuit 74 (next stage) can be functionally replaced by a single multiplying digital-to-analog converter (MDAC). I have further observed that the MDAC of each stage can also be implemented by using either a binary-weighted capacitor (BWC) array as shown in FIG. 3 or a unit capacitor (UC) array as shown in FIG. 4. In FIG. 3, the BWC-based MDAC is driven by an encoded digital input while the UC-based MDAC can be directly driven by a decoded digital input.

Figure 5A:
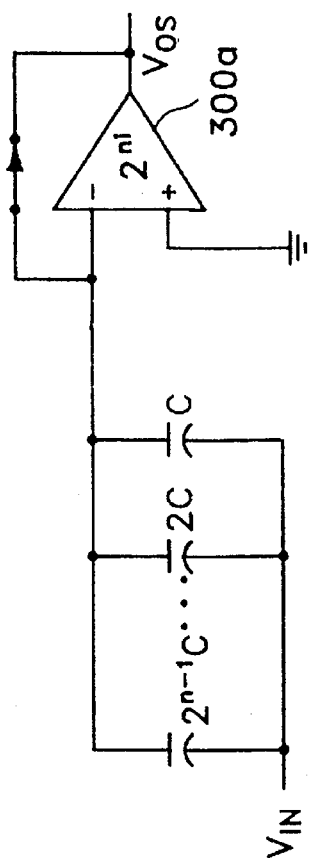
FIGS. 5A and 5B are circuit diagrams illustrating the operation of the MDAC during the input sampling mode and error amplification mode, respectively.
Figure 5B:
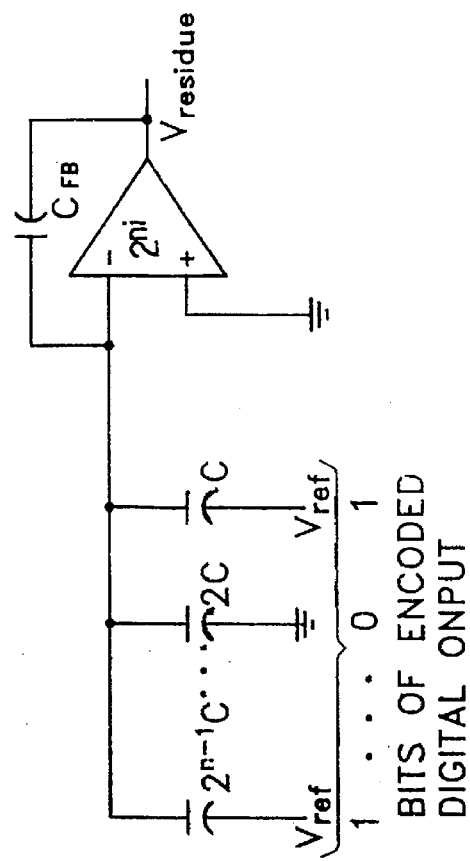

A simplified operation principle of the MDAC using a BWC-array as shown in FIG. 3 is illustrated in FIGS. 5A and 5B. During the sampling phase of FIG. 5A, an analog input voltage $V_{IN}$ is sampled via the capacitor array, and a sampled output voltage $V_{OS}$ is then transmitted to the next stage. During the amplification phase of FIG. 5B, the respective capacitors are switched to $V_{ref}$ or ground depending on the digital bits corresponding to the sampled analog voltage. The residue voltage $V_{residue}$, the difference between the sampled input signal and the reconstructed analog output signal, is amplified by $2^{n_1}$ and is sent to the next stage.

Figure 6:
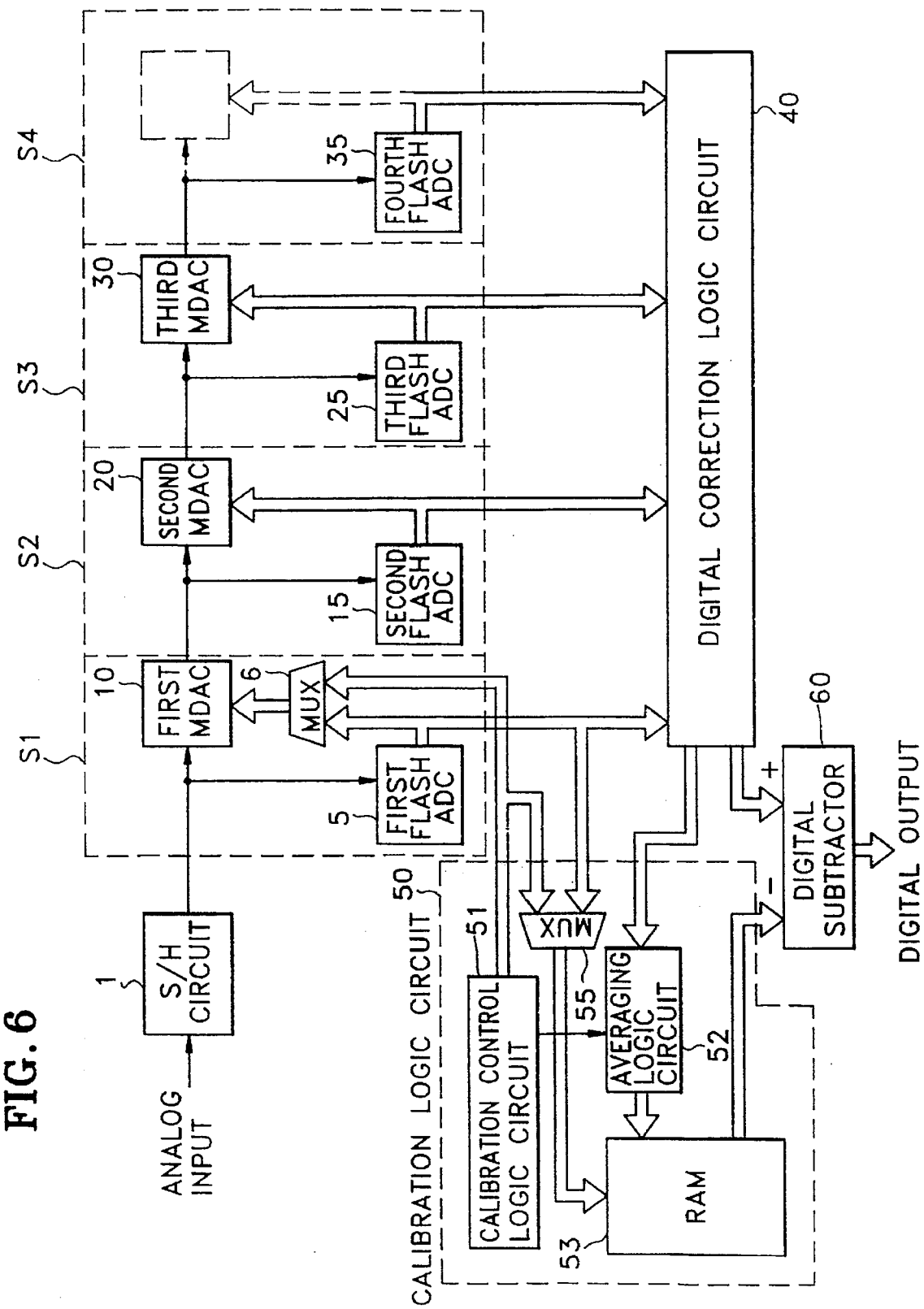
FIG. 6 is a block diagram of a pipelined four-stage ADC according to a preferred embodiment of the present invention.

Referring now to FIG. 6, which is a block diagram of a pipelined four-stage ADC according to a preferred embodiment of the present invention. In FIG. 6, an analog signal is input via a sample-and-hold (S/H) circuit 1 which repeatedly samples the analog input signal at a certain time interval and holds a constant output value (voltage) corresponding to the most recent sampling. Then, in the first stage S1 receiving the voltage value from the S/H circuit 1, a first flash ADC 5 determines a most significant bit (MSB) consisting of $n_1$ bits. Meanwhile, a digital code of the $n_1$ bits is changed back into an analog representation by DAC means (not shown) within a first MDAC 10 of the first stage S1, and a reconstructed analog signal is obtained therein. The difference between the reconstructed analog signal and the analog input signal received from the S/H circuit 1 is generated as a residue signal representative of the error in the digital output of the flash ADC 5. The residue signal is then amplified by an amplification process (not shown) for output to a second stage S2.

In second stage S2, a second flash ADC 15 determines a second MSB consisting of $n_2$ bits, the digital code of which is converted into an analog representation by DAC means in a second MDAC 20 of second stage S2. Similar to the operation of the first stage S1, the difference (i.e., residue signal) between the reconstructed analog signal converted by the DAC in second MDAC 20 of second stage S2 and the analog signal output from first stage S1 is obtained and is then sent to a third stage S3. The $n_3$ bits and $n_4$ bits respectively constituting the next lower bits are generated in third and fourth stages S3 and S4, through the same procedure as described above.

The pipelined four-stage ADC as shown in FIG. 6 also includes a digital correction logic circuit 40 coupled to receive partial conversion outputs from the first, second, third and fourth stages for digital correction; a digital calibration logic circuit 50 for calibrating digital codes of the front stage of the pipelined four-stage ADC; and a digital subtractor 60 for outputting a digital output signal.

Digital correction circuit 40 includes registers, adders and correctors (none shown) therein and receives the digital values from first through fourth ADCs 5, 15, 25 and 35 of the respective stages S1, S2, S3 and S4. Digital calibration logic circuit 50 comprises a calibration control logic 51, an averaging logic circuit 52, a RAM 53, and a multiplexer 55. Digital subtractor 60 is simply used to subtract errors stored in RAM 53 from an uncalibrated, raw digital output of digital correction logic circuit 40.

The combined resolution of the ADC shown in FIG. 6 is the sum of the number of bits for each stage in the four-stage architecture, minus one overlapping bit between each of the respective stages, or $n_1+n_2+n_3+n_4-3$ bits. Here, the three overlapping bits are used for bit correction when an error is generated due to the MDAC gain error, low resolution flash ADC error, etc. Thus, for a k-stage case, the obtainable resolution (R) can be expressed:

$$n_1+n_2+\ldots+n_k-(k-1) \text{ bits}$$

Accordingly, a 12-bit four-stage pipelined ADC is embodied, in which an MDAC having a BWC array in the first stage is employed to improve the INL characteristic, and an MDAC having a UC array in the latter stages thereof is employed to improve the DNL characteristic. Each stage includes a 4-bit flash ADC and a 4-bit MDAC. In order to obtain 12-bit resolution (and higher) in the pipelined multi-stage ADC, the front-end stages require calibration where all the code errors generated in first stage S1 are measured for subsequent quantization in the other three stages (S2, S3 and S4) which employ MDACs using UC arrays. The measured and quantized errors are then stored in RAM 53 during a calibration period via the error-averaging logic circuit 52. During the calibration period, calibration control logic circuit 51 generates an address of RAM 53 via the multiplexer 55 and transmits data to MDAC 10 via multiplexer 6 of the first stage S1. Consequently, the first-stage code errors are measured and quantized through the latter stages and digital correction logic circuit 40. These errors are measured a predetermined number of times, averaged by the averaging logic circuit 52, and finally stored in RAM 53.

During normal conversion, non-critical errors such as the offset and feedthrough errors between the respective stages are digitally corrected by a single overlapping bit by the digital correction logic circuit 40. Here, the first MDAC 10 receives the data from the first flash ADC 5 via multiplexer 6; and the output of first flash ADC 5 can be also used as the address of RAM 53 via multiplexer 55 for reading out the stored error data. Consequently, the measured and RAM-stored errors are then subtracted by subtractor 60 from the 13-bit raw output code which is not calibrated but is corrected. The least significant bit (LSB) is discarded to reduce truncation errors caused by the digital processing, to result in a 12-bit linear output code.

Since the latter stages measure the inaccuracy of the front-end stage, the latter-stage DNL error should be as small as possible. To calculate DNL error, it should be noted that the number of capacitors employed is the same for both the BWC-based MDAC and the UC-based MDAC since the MOS capacitors in a BWC array are realized as parallel BWC combinations of small value unit capacitors, and the applied analog input signal is collectively stored in all the capacitors of each array. As a result, the input sampling portion is the same in either case (all stages). However, when a digital code is applied during amplification process, the switching mode of the BWC-based MDAC capacitors is quite different from that of the UC-based MDAC capacitors. For UC-based n-bit MDACs, the estimated maximum DNL error is:

$$\text{MAX}\sqrt{\delta_i^2}$$

and for BWC-based n-bit MDACs is $$\text{MAX}\sqrt{\sum_{i=1}^{2^n-1}\delta_i^2}$$

where $\delta_i$ is a normalized mismatching error of capacitor i.

In the midpoint transition of a 4-bit MDAC, for example, only one capacitor is changed into the UC-based MDAC (from 000000001111111 into 000000011111111), while the BWC-based MDAC changes all fifteen capacitors (from 0111H into 1000H or from 000000001111111 into 111111110000000). Even though both the BWC-based array and the UC-based array can have the same common-centroid geometry to minimize systematic and random errors, the BWC-based MDAC has greater possibility for larger DNL errors than the UC-based MDAC, primarily due to the greater number of switching capacitors. Especially in the midpoint transition, the BWC-based MDAC statistically shows the largest DNL error.

This characteristic can be directly applied to the latter stages of the multi-stage pipelined ADC since the overall ADC transfer function is heavily affected by the latter-stage DNL error. As a result, for good DNL characteristics, the UC-based MDAC is the best choice for the latter stages.

As an example, a 12-bit pipelined ADC can be implemented by adding one more stage to the front end of the 10-bit ADC which uses the UC-based MDAC. A digital calibration technique is applied to the front-end stage of the 12-bit ADC, using digital calibration circuitry. Two kinds of MDAC front-end architecture are considered. The first architecture is a UC-based MDAC, and the second architecture is a BWC-based MDAC. Although the first-stage inaccuracy is measured and corrected in the digital domain, the INL characteristic is still affected by the digital truncation errors due to the finite resolution of the latter stages, which is used for error measurement. When considering the effect of the digital truncation errors resulting from repeated digital addition operations, the worst-case INL error is estimated in LSB units as:

$$\sqrt{\frac{(n-i)(i-1)}{12(i-1)}}$$

for $i=\{1^\sim n\}$.

In case of the UC-based 4-bit MDAC, the total number n is sixteen, so that sixteen digital additions are performed, and the maximum standard deviation of the INL value of 0.56 LSB will occur at the midpoint (n=16, i=8) while the BWC-based 4-bit MDAC, which has an intrinsically symmetrical characteristic with respect to the midpoint (n=8, i=4), has a maximum deviation of 0.38 LSB. Consequently, the BWC-based array is implemented in the first-stage MDAC of a 12-bit ADC in order to improve the INL characteristic.

As mentioned earlier, the conventional techniques use the code symmetry in the first-stage 4-bit MDAC employing the BWC-array calibrate only eight codes with eight bytes of memory.

Consequently, these techniques suffer from a truncation error doubling effect in the midpoint transition, resulting in linearity degradation. That is, since the linearity error is +ε immediately above the center point and −ε immediately below the center point, the total linearity error for the midpoint transition can be as much as 2ε. Therefore, the linearity between codes can be degraded by an error factor of more than 0.5 LSB of the final target resolution.

Figure 7A:
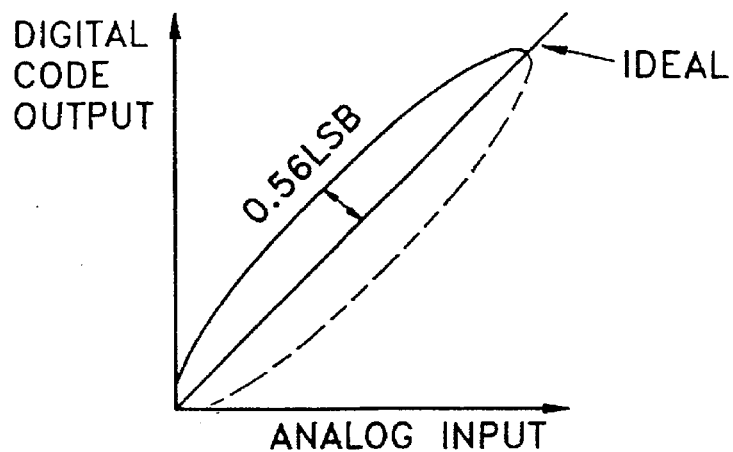
FIGS. 7A, 7B and 7C show statistical integral non-linear characteristics of a four-stage 12-bit ADC utilizing a UC-based MDAC, a BWC-based MDAC with code symmetry (only eight codes calibrated), and a BWC-based MDAC with no code symmetry (sixteen codes calibrated), respectively.
Figure 7B:
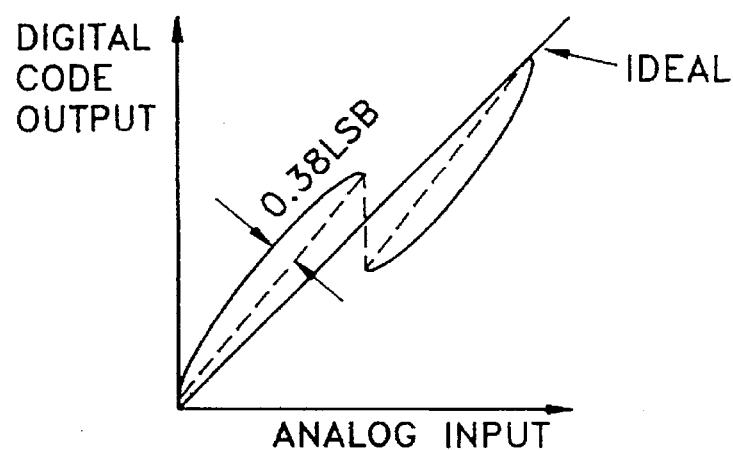
Figure 7C:
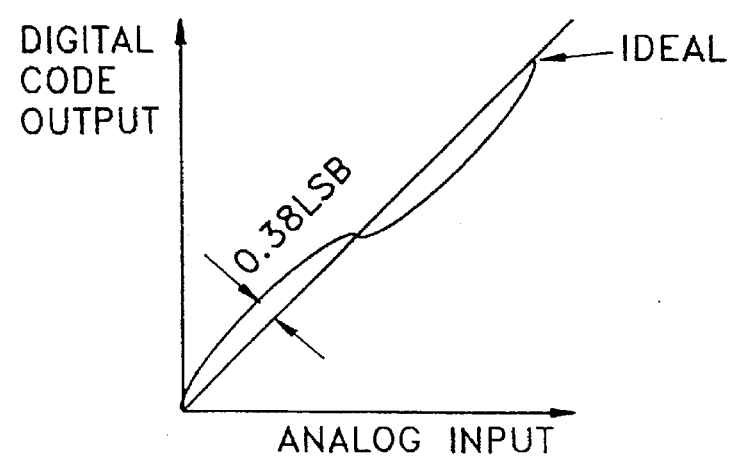

In the present invention, all sixteen codes are calibrated in the BWC-based MDAC. Consequently, the error-doubling effect does not occur at the midpoint transition, resulting in INL improvement due to correlating symmetrical truncation errors. This effect is illustrated in FIGS. 7A–7C.

Also, since the linearity of the multi-stage ADC is severely dominated by the front-end stage, it is appropriate that the output of first stage S1 ($n_1$ bits) be calibrated. For this purpose, RAM 53 having a capacity of $2^{n_1}$ bits is required for storing the calibrated data with respect to every code combination of the front-end stage. The calibrated data is then subtracted from the digital code corresponding to the input signal, to provide an actual exact code.

This general architecture can be expanded to more than four stages and higher than 12-bit resolution, and hence two or more front-end stages can be calibrated using BWC-based MDACs, while the proposed 12-bit ADC calibrates only the first stage.

Since the maximum resolution can be implemented without calibration in the latter stages is limited to ten bits, one or more calibration stages may be needed in front of the 10-bit uncalibrated latter stages for the application of higher resolution. Thus, in this embodiment, the calibration is required in the front-end stage for high accuracy.

Returning now to FIG. 6, the operation of the present embodiment is will be described in more detail. In FIG. 6, to achieve 10-bit accuracy is needed, all the code errors generated in first stage S1 are measured and quantized in the other three stages (S1, S2 and S3), which employ MDACs with UC arrays. The sixteen code errors in the MDAC of the first stage are all calibrated in the digital domain to improve the INL characteristic. Thus, to improve the linearity, the memory capacity for storing the errors is doubled from eight addresses to sixteen addresses. Such memory expansion can be easily applied in the pipelined multi-stage ADC architecture of the present invention, particularly in view of the availability of chip area and the resulted improvement in the performance of the ADC.

In the preferred embodiment of the present invention, 12-bit ADC calibration is described in the case where the MDAC in the first stage among the four-stages shown in FIG. 6 is implemented by BWC array. It should be noted, however, that the present invention can be embodied by more than four stages and greater than 12-bit resolution. Accordingly, the MDACs with BWC arrays can be employed in two or more front-end stages. Similarly, the present invention can also be constituted in five stages, six stages, etc. to accommodate various levels of desired resolution.

In FIG. 6, however, digital logic circuit which receives digital values from the first, second, third and fourth flash ADCs 5, 15, 25 and 35 in the respective stages S1, S2, S3 and S4 includes a digital correction logic circuit 40 and a calibration logic circuit 50 which operate in a digital domain in order to provide a normal digital value in which performance is not degraded due to the offset error, the gain error, and the mismatching error between the internal capacitive and resistive elements.

Gain errors, however, can be generated between the respective pipelined stages. For example, if an error is generated by overlapping the LSB of a former stage and the MSB in the following stage, a gain error correction operation is performed. Since the present invention incorporates the calibrated data of the whole code, the doubling effect of the code error at the center does not appear. Also, since the errors at the positive and negative sides have a correlation with each other, the linearity becomes statistically better.

If the $n_1$ bits, $n_2$ bits, $n_3$ bits and $n_4$ bits are all the same resolution; that is, they all contain the same number of the bits, all stages can be constituted by the same structure and circuit. (The MDAC portion of the final stage is not used.) The number of the pipelined stages and the number of bits in each stage can be mutually adjusted according to the specific application; that is to say, in view of power consumption and sampling speed considerations.

As described above, among a plurality of stages, the present invention uses the MDAC with BWC array in the front-end stage and the MDAC with UC array in the latter stages, in order to improve linearity. Specifically, only the MSB stage can employ the BWC array and the remaining stages employ the UC arrays. Also, several stages forming the upper bits may employ the BWC array, but with the remaining stages employing UC arrays. Such a pipelined architecture improves the INL and DNL characteristics remarkably and increases the overall yield.

The front end MDAC determines the MSB, to thereby influence the whole INL characteristic. Thus, since the code symmetry is not used, the use of an MDAC with the BWC array having a correlation among all the codes improves the overall linearity. As a result, the INL characteristic tends to improve. Meanwhile, the latter-stage MDACs determine the lower bits. Thus, if the latter stages use MDACs with UC-based capacitor arrays, the difference between adjacent codes contribute only the error of the individual unit capacitor, thereby remarkably improving the DNL characteristic.

Referring again to FIGS. 3 and 4 which shows circuit diagrams of MDAC stages using BWC and UC arrays, respectively. Here, it will be understood that the BWC-based MDAC should be used in the front-end stage or stages and the UC-based MDAC should be used in the latter stages. Also, the MDAC implemented by BWC array as shown in FIG. 3 is driven by an encoded digital input, and the MDAC implemented by UC array as shown in FIG. 4 is directly driven by a decoded digital input.

Now, the operation of the BWC-based MDAC will be described with reference to FIG. 3. In FIG. 3, during the sampling operation as shown in FIG. 5A, an analog input voltage is connected to the respective capacitor terminals 1 in a first switch 100a which is connected to one end of the MDAC capacitor array, and is thereby sampled. During the amplification operation as shown in FIG. 5B, the respective capacitors are connected to terminals 2 of first switch 100a for subsequent connection with either a reference voltage $V_{ref}$ or ground potential via a second switch 200b, according to the encoded digital input corresponding to the sampled analog voltage. A residue signal representing the difference between the sampled input signal and the reconstructed analog output signal of the DAC is amplified by $2^n$ in an operational amplifier 300a and transmitted to a next succeeding stage. Here, when first switch 100a is located at position 1, the analog signal of a preceding stage is charged in the capacitor array to hold the input values. When first switch 100a is, however, located at position 2, second switch 200a operates so that the reference voltage or ground potential is connected to the respective capacitors according to the digital signal value, to thereby perform digital-to-analog conversion. In the capacitor array, the MSB capacitor has a value of $2^{n-1}$ C and the LSB capacitor has a value of 1 C.

Since the capacitors hold the accumulated charge of the analog input, a residue between the analog input and the digital-to-analog converted value is amplified through a feedback capacitor $C_{FB}$. Gain is determined according to the ratio of the total value of the capacitor array and the value of the feedback capacitor $C_{FB}$. However, since each of these capacitor values can have a mismatching error, such an error is reduced by the proposed calibration and correction.

The MDAC functions include: receiving an analog input of the preceding stage and holding the received for a certain time; converting a digital code signal into an analog signal, a function of producing a residue signal by obtaining a difference between the held signal and the converted analog signal; and amplifying the residue signal.

Next, the operation of the UC-based MDAC will be described with reference to FIG. 4. In FIG. 4, the reference voltage or ground potential is connected to the respective unit capacitors according to a value of the decoded digital input, via selection switches 100b and 200b. Here, the total number of unit capacitors in the array connected to an operational amplifier 300b is $2^n$. Thus, if the MDAC with UC array is employed in the latter stages, error variation between adjacent codes is small which results in an improvement of the DNL characteristics.

Figure 8:
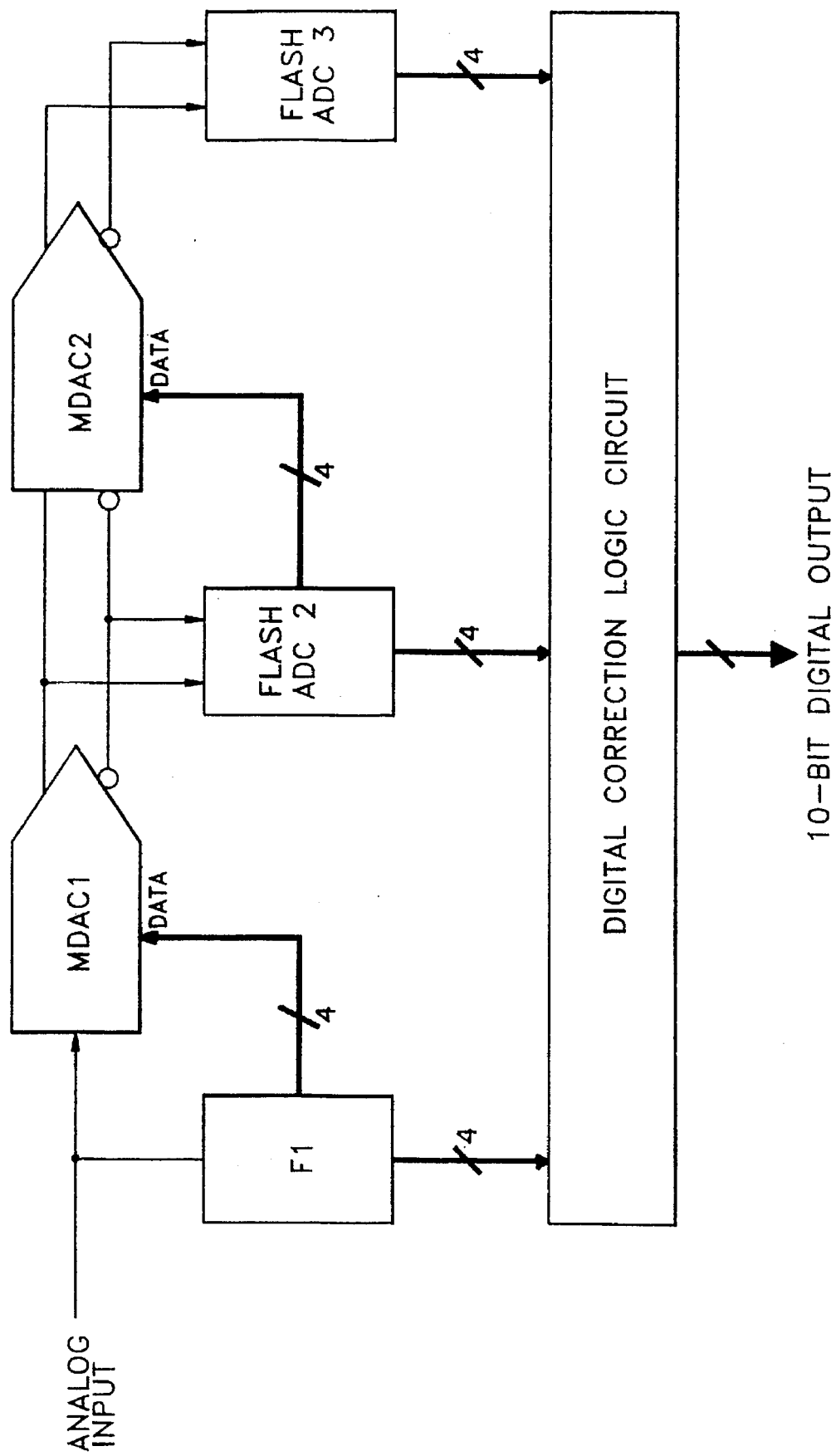
FIG. 8 is a block diagram of a 3-stage 10-bit ADC used in the latter stages of the pipelined four-stage ADC shown in FIG. 6.

In order to confirm the operation of the architecture employed in the present invention and verify the linearity characteristics and yields obtained thereby, several hundred samples of a 3-stage 10-bit ADC shown in FIG. 8 and a 4-stage 12-bit ADC shown in FIG. 6 are simulated by a full-differential behavioral model of ADC operation having 4-bit accuracy. Here, each stage is made of a 4-bit flash ADC and a 4-bit MDAC, and all the resistor strings used in 4-bit flash ADCs are assumed with 10% random mismatching errors.

Figure 9:
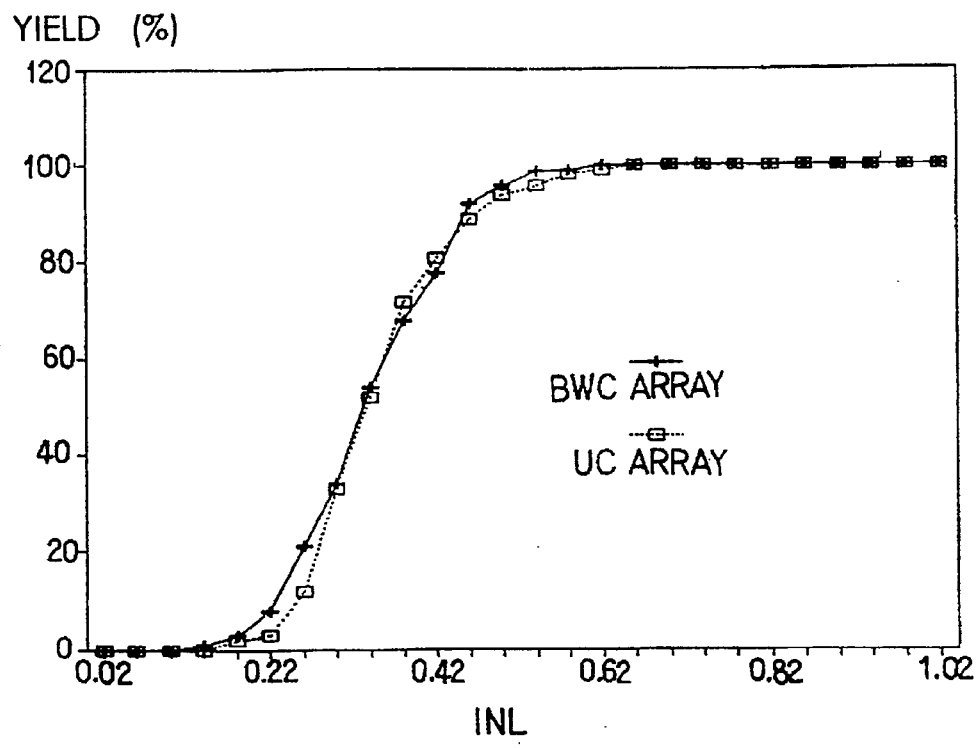
FIGS. 9 and 10 are simulation graphs showing the DNL and INL characteristics of the 3-stage 10-bit ADC shown in FIG. 8, respectively.
Figure 10:
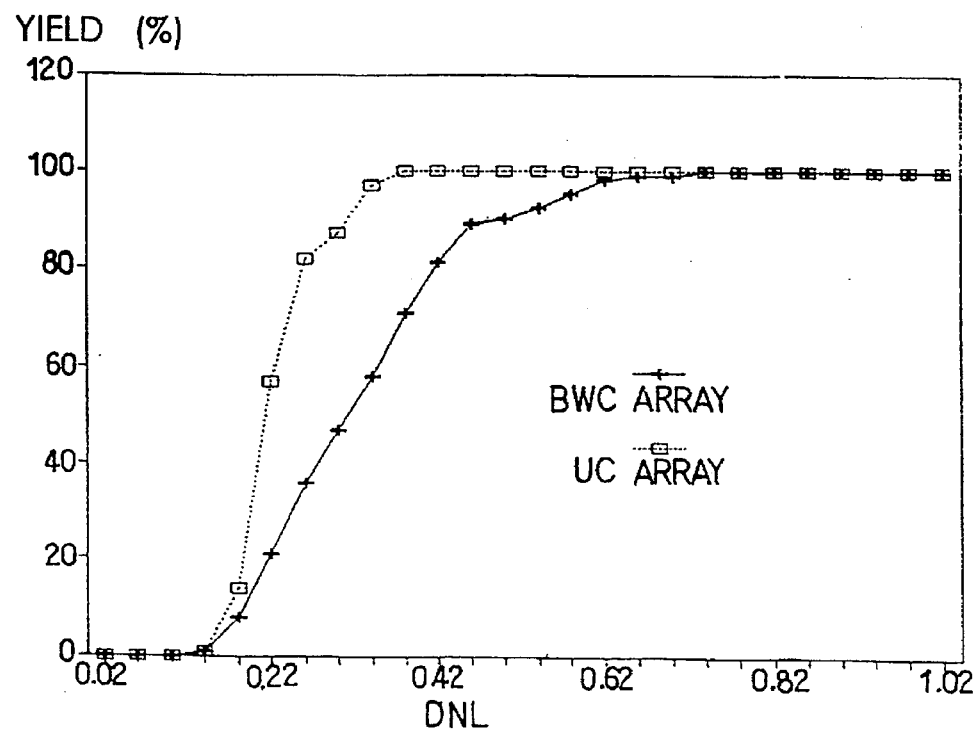

Simulated results of an uncalibrated 3-stage 10-bit ADC which can be used in the latter stages of a 4-stage 12-bit ADC is shown in FIGS. 9 and 10. Here, the capacitor mismatching ratio is assumed to be 0.2%, which is a typical value for 10-bit ADCs based on capacitor matching accuracy. As shown in FIG. 9, the INL curve of the ADC using the UC-based MDAC is almost the same as that of the ADC using the BWC-based MDAC. On the other hand, as shown in FIG. 10, the BWC-based ADC samples obtained an approximately 75% yield with respect to the DNL error of 0.4 LSB, while all the UC-based ADC samples are within 0.4 LSB.

Figure 11:
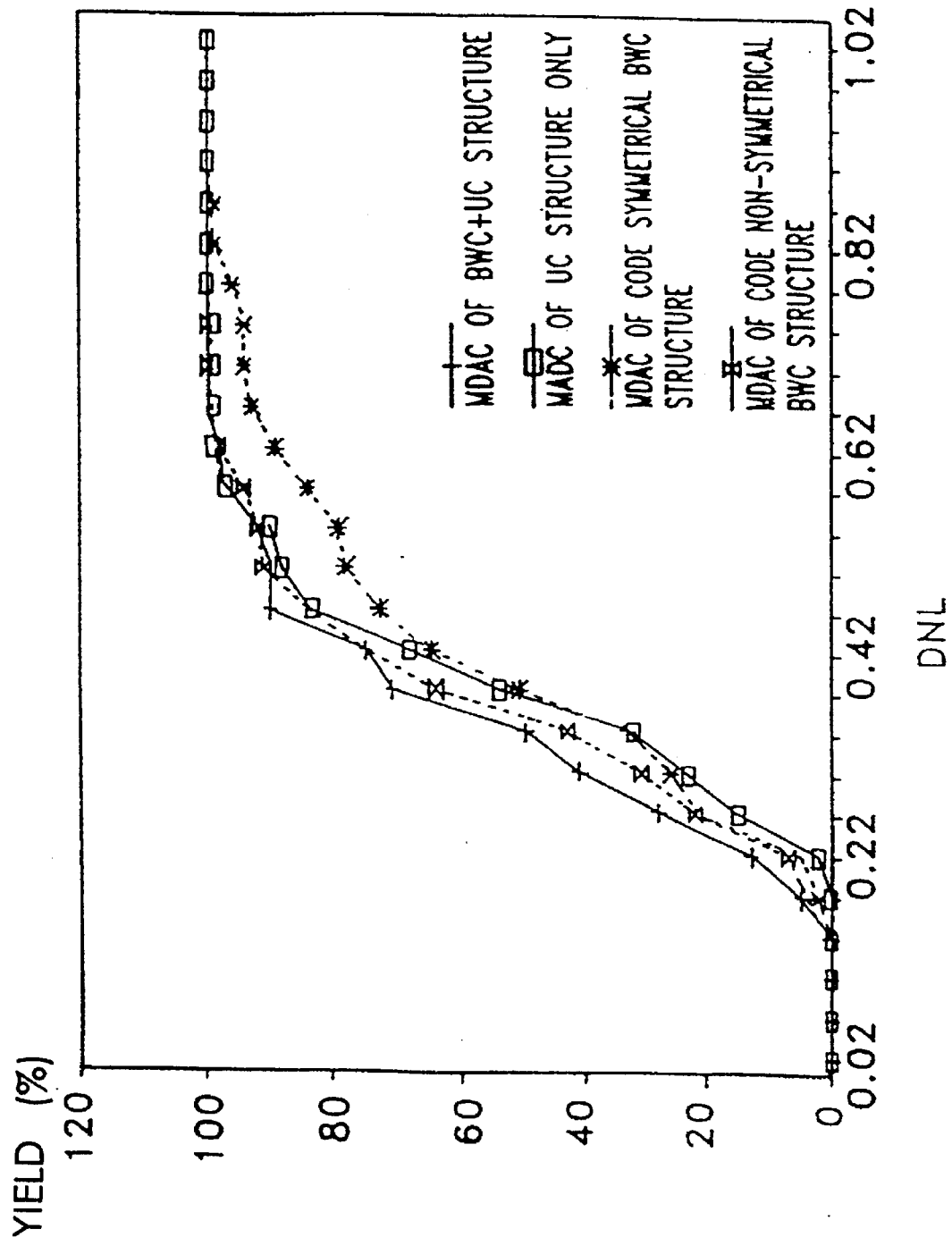
FIGS. 11 and 12 are simulation graphs showing DNL and INL comparisons for various structures of the pipelined four-stage ADC shown in FIG. 6, after calibration, respectively.
Figure 12:
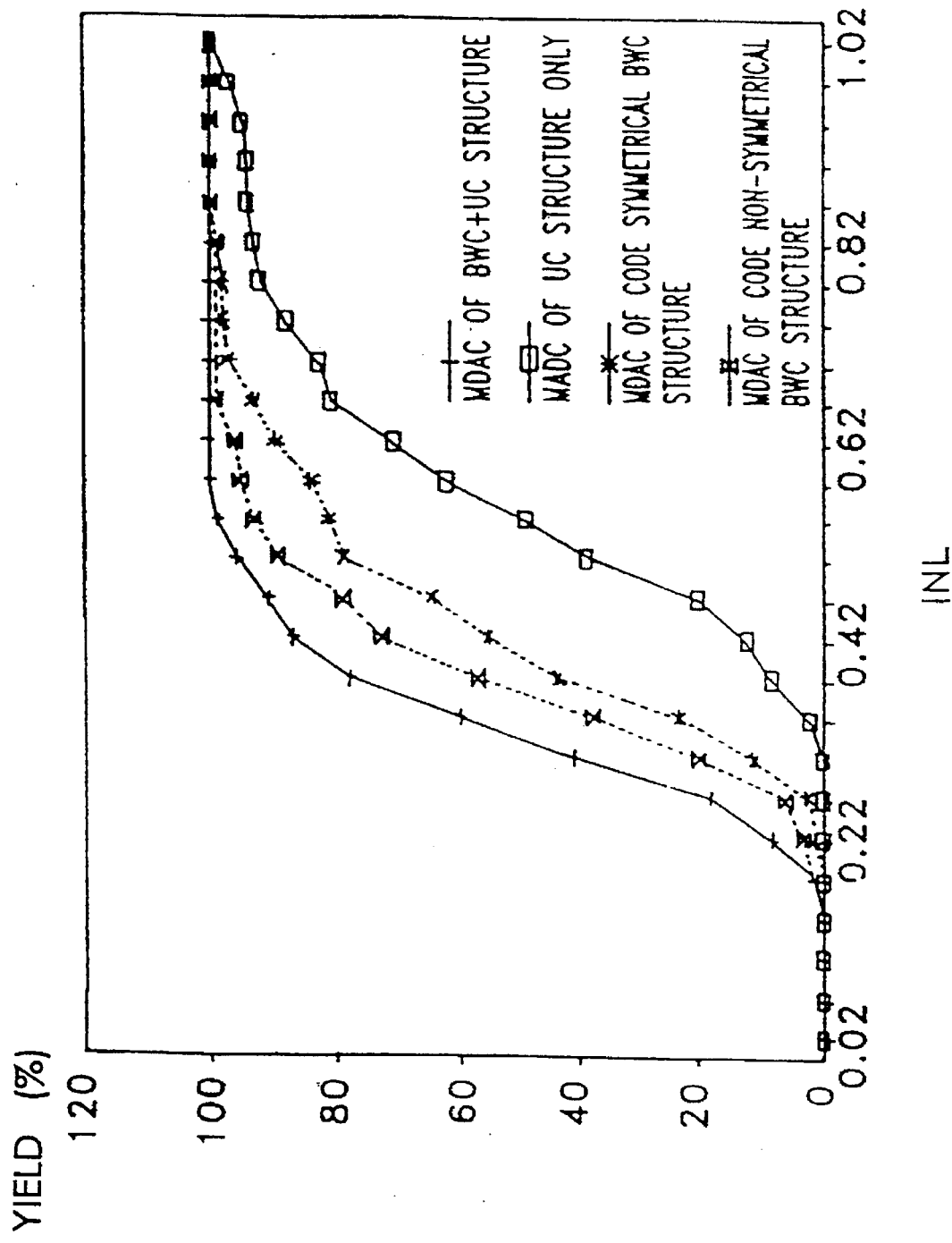

Simulated results of the proposed 4-stage 12-bit ADC of FIG. 6, after calibration, are shown in FIGS. 11 and 12. Here, too, it is assumed that the unit capacitors in the MDACs have a random mismatching ratio of 0.2%. In the graphs, the proposed ADC is compared to three other types of architecture: where all the MDACs of the ADC employ UC arrays; where all the MDACs employ a BWC-array with only 8-code calibration in which a code symmetry calibration is adopted; and where all the MDACs employ a BWC-array with 16-code calibration in which no code symmetry calibration is applied. It can be seen that the highest yield is obtained by the proposed 12-bit pipeline architecture.

Referring to FIG. 11, the ADC including the BWC-based MDACs using code symmetry shows the worst DNL characteristic, while the ADC of the present invention, i.e., that using the MDACs having both BWC and UC arrays and without using the code symmetry, has the best DNL characteristic. Also, when the UC array is compared with the BWC array, the UC array has the better DNL characteristic.

Referring to FIG. 12, the ADC having all UC-based MDACs has the worst INL characteristic. Also, when the ADC using code symmetry is compared with that not using the code symmetry, the non-symmetrical ADC using a front-end BWC-based MDAC has the better INL characteristic. However, the ADC utilizing MDACs with a front-end BWC array and latter-stage UC arrays, without using code symmetry, has the best INL characteristic.

Thus, in the ADC according to the present invention, the calibration and correction portion in the digital logic circuit prevents the performance degeneration such as the offset error, the gain error, etc. The MDAC using the BWC array is used in the front end and MDACs using the UC array are used in the latter stages, to improve the INL and DNL characteristics remarkably. Also, the generation of missing codes is suppressed without using code symmetry, while improving the yield and overall performance.

As described above, the present invention has been described in detail with reference to an embodiment only. However, it will be apparent to a person skilled in the art that various modifications in the specific matter of the present invention are possible, without departing from the scope of the invention.

What is claimed is:

1. A pipelined architecture multi-stage analog-to-digital converter, comprising:

a sample-and-hold circuit for sampling and holding an analog input signal to be converted into a digital signal;

a flash analog-to-digital converter of each stage for detecting digital bits corresponding to said analog input signal; and a multiplying digital-to-analog converter of each stage for converting said digital signal into an analog converted signal according to detected digital bits, amplifying the difference between the analog input signal and the analog converted signal as a residue signal, said residue signal being supplied as the analog input signal to the next successive pipelined stage of said multi-stage analog-to-digital converter, wherein, among the multiple stages of said pipelined architecture, said multiplying digital-to-analog converter of the front stage of said multi-stage analog-to-digital converter is implemented by a binary-weighted capacitor array and said multiplying digital-to-analog converter of the latter stages of said multi-stage analog-to-digital converter is implemented by a unit capacitor array.

2. A pipelined architecture multi-stage analog-to-digital converter as claimed in claim 1, wherein said multiplying digital-to-analog converter implemented by said binary weighted capacitor array is employed in at least the front stage, and the remaining multiplying digital-to-analog converters implemented by said unit capacitor array are employed in the remaining stages of said multi-stage analog-to-digital converter.

3. A pipelined multi-stage analog-to-digital converter as claimed in claim 1, further comprising calibration means for calibrating all digital codes in said binary-weighted capacitor array based multiplying digital-to-analog converter so as to suppress an error-doubling effect at the midpoint transition.

4. A pipelined multi-stage analog-to-digital converter for converting an analog input signal as a sampled and held signal into a digital output signal, said pipelined multi-stage analog-to-digital converter comprising:

a flash analog-to-digital converter located in each stage, for converting the analog input signal into a digital converted signal;

a multiplying digital-to-analog converter located in each stage, for converting the digital converted signal into an analog reconstructed signal, obtaining the difference between the analog reconstructed signal and the analog input signal as a residue signal, and transmitting the residue signal to a next stage; and a digital logic circuit coupled to receive the digital converted signal from said flash analog-to-digital converter of each stage, for converting all received digital converted signals into digital coded values for code error calibration and correction to provide said digital output signal, said digital logic circuit comprising:

a digital correction logic circuit for correcting non-critical errors between stages;

a digital calibration logic circuit for calibrating each code error, and for controlling the timing of a calibration sequence and generating memory address signals and control signals;

an averaging logic circuit for averaging front-end stage errors to produce a mean value;

a RAM for storing the average code errors; and a digital subtractor for subtracting stored errors from an uncalibrated digital output of said digital correction logic circuit.

5. A pipelined multi-stage analog-to-digital converter as claimed in claim 4, wherein at least one stage including a most significant bit among a plurality of the stages employs the multiplying digital-to-analog converter implemented by a binary-weighted capacitor array.

6. A pipelined multi-stage analog-to-digital converter as claimed in claim 5, wherein, when said multiplying digital-to-analog converter implemented by said binary-weighted capacitor array is calibrated, a correction operation is performed with respect to all codes to thereby suppress generation of missing code.

7. A pipelined multi-stage analog-to-digital converter as claimed in claim 4, wherein said digital logic circuit further comprises a selector for selecting one of the output of said digital calibration logic circuit and the output of said digital correction logic circuit for transmission to said multiplying digital-to-analog converter.

8. A pipelined multi-stage analog-to-digital converter for converting an analog input signal to a digital output signal, said pipelined multi-stage analog-to-digital converter comprising:

a sample-and-hold circuit for sampling the analog input signal and providing a sampled analog input signal;

a first flash analog-to-digital converter coupled to said sample-and-hold circuit, for converting the sampled analog input signal to a first digital output signal;

a first multiplying digital-to-analog converter coupled to said first flash analog-to-digital converter, for converting said first digital output signal to a first pipelined analog signal and comparing said first pipelined analog signal with said analog input signal to provide a first conversion residue signal representing code errors in said first digital output signal;

a second flash analog-to-digital converter for converting said first conversion residue signal to a second digital output signal;

a second multiplying digital-to-analog converter coupled to said second flash analog-to-digital converter, for converting said second digital output signal to a second pipelined analog signal and comparing said second pipelined analog signal with said first conversion residue signal to provide a second conversion residue signal representing code errors in said second digital output signal;

a third flash analog-to-digital converter for converting said second conversion residue signal to a third digital output signal;

a third multiplying digital-to-analog converter coupled to said third flash analog-to-digital converter, for converting said third digital output signal to a third pipelined analog signal and comparing said third pipelined analog signal with said second conversion residue signal to provide a third conversion residue signal representing code errors in said third digital output signal;

a fourth flash analog-to-digital converter for converting said third conversion residue signal to a fourth digital output signal;

digital correction means for correcting errors in said first, second, third and fourth digital output signals and providing a corrected pipelined digital signal;

calibration means comprising a memory storing the code errors in said first digital output signal, for calibrating said first digital output signal prior to transmission to said first multiplying digital-to-analog converter and for providing an error digital signal representing stored code errors addressed by said first digital output signal; and digital subtractor means for digitally subtracting said error digital signal from said corrected pipelined digital signal to provide said digital output signal.

9. The pipelined multi-stage analog-to-digital converter as claimed in claim 8, further comprised of said first flash analog-to-digital converter and said first multiplying digital-to-analog converter forming a first stage, said second flash analog-to-digital converter and said second multiplying digital-to-analog converter forming a second succeeding stage, said third flash analog-to-digital converter and said third multiplying digital-to-analog converter forming a third succeeding stage, and said fourth flash analog-to-digital converter forming a fourth succeeding stage of said pipelined multi-stage analog-to-digital converter.

10. The pipelined multi-stage analog-to-digital converter as claimed in claim 9, wherein said calibration means comprises:
calibration control means for calibrating each code error in said first digital output signal and controlling the timing of a calibration sequence;
average logic means for averaging all code errors in said first digital output signal via said digital correction means and providing averaged code errors to be stored in said memory; and
said memory for storing the averaged code errors to be subtracted by said digital subtractor means from an uncalibrated digital output representative of said corrected pipelined digital signal to provide said digital output signal.

11. The pipelined multi-stage analog-to-digital converter as claimed in claim 10, wherein said first multiplying digital-to-analog converter in said first stage of said pipelined multi-stage analog-to-digital converter is implemented by a binary-weighted capacitor array.

12. The pipelined multi-stage analog-to-digital converter as claimed in claim 11, wherein said second and third multiplying digital-to-analog converters in said second and third stages of said pipelined multi-stage analog-to-digital converter are each implemented by an unit capacitor array.

13. The pipelined multi-stage analog-to-digital converter as claimed in claim 9, wherein said first multiplying digital-to-analog converter in said first stage of said pipelined multi-stage analog-to-digital converter is implemented by a binary-weighted capacitor array.

14. The pipelined multi-stage analog-to-digital converter as claimed in claim 13, wherein said first multiplying digital-to-analog converter implemented by said binary-weighted capacitor array comprises:
an operational amplifier having an output terminal for providing said first conversion residue signal representing code errors in said first digital output signal to a next succeeding stage;
a capacitor array connected in parallel to a first input terminal of said operational amplifier, said capacitor array comprising a most-significant-bit capacitor with a value of $2^{n-1}$ C and a least-significant-bit capacitor with a value of 1 C for accumulating charges of said analog input signal received via said sample-and-hold circuit and holding the accumulated charges of said analog input signal;
a feedback capacitor connected in parallel to said first input terminal of said operational amplifier, for amplifying said first conversion residue signal according to the ratio of the total value of said capacitor array and the value of said feedback capacitor;
first switch means for selectively enabling said capacitor array and said feedback capacitor to receive said analog input signal received via said sample-and-hold circuit and a reference voltage; and
second switch means for enabling transmission of said reference voltage from one of a first voltage and a second voltage in dependence upon reception of an encoded form of said first digital output signal.

15. The pipelined multi-stage analog-to-digital converter as claimed in claim 9, wherein said second and third multiplying digital-to-analog converters in said second and third stages of said pipelined multi-stage analog-to-digital converter are each implemented by an unit capacitor array.

16. The pipelined multi-stage analog-to-digital converter as claimed in claim 15, wherein said second and third multiplying digital-to-analog converters each implemented by said unit capacitor array comprises:
an operational amplifier having an output terminal for providing said second and third conversion residue signals, respectively;
a capacitor array connected in parallel to a first input terminal of said operational amplifier, said capacitor array accumulating charges of preceding one of said first and second pipelined analog signals and holding the accumulated charges of said preceding one of said first and second analog input signals;
a feedback capacitor connected in parallel to said first input terminal of said operational amplifier, for amplifying one of said second and third conversion residue signals according to the ratio of the total value of said capacitor array and the value of said feedback capacitor;
first switch means for selectively enabling said capacitor array and said feedback capacitor to receive preceding one of said first and second pipelined analog signals and a reference voltage; and
second switch means for enabling transmission of said reference voltage from one of a first voltage and a second voltage in dependence upon reception of an decoded form of said preceding one of said second and third digital output signals.

17. The pipelined multi-stage analog-to-digital converter as claimed in claim 9, further comprised of said first, second, third and fourth flash analog-to-digital converters being 4-bit converters.

18. The pipelined multi-stage analog-to-digital converter as claimed in claim 9, further comprised of said first, second and third multiplying digital-to-analog converters being 4-bit converters.

19. A pipelined multi-stage analog-to-digital converter, comprising:
a sample-and-hold circuit for successively sampling and holding an analog input signal to be converted to a digital code;
a plurality of stages coupled in series in a pipeline, a first stage of the pipeline being connected to receive an output of said sample-and-hold circuit and producing a first part of said digital code and a residue voltage, each stage of the pipeline comprising a flash analog-to-digital converter, said flash analog-to-digital converter of each of an intermediate and a final stage converting a residue voltage from a preceding stage to a succeeding part of said digital code, said first stage and said intermediate stage of the pipeline further comprising a multiplying digital-to-analog converter converting a preceding part of said digital code to said residue voltage to a succeeding stage;
digital correction means for correcting errors in said digital code output from said flash analog-to-digital converter in each stage of the pipeline and providing a corrected pipelined digital code;

calibration means for calibrating said first part of said digital code and for providing an error digital code; and digital subtractor means for subtracting said error digital code from said corrected pipelined digital code to provide a digital output code.

20. The pipelined multi-stage analog-to-digital converter as claimed in claim 19, wherein said multiplying digital-to-analog converter of said first stage of the pipeline is implemented by a binary-weighted capacitor array.

21. The pipelined multi-stage analog-to-digital converter as claimed in claim 20, wherein said multiplying digital-to-analog converter of succeeding stages of the pipeline is implemented by a unit capacitor array.

22. The pipelined multi-stage analog-to-digital converter as claimed in claim 21, wherein said multiplying digital-to-analog converter of each succeeding stage of the pipeline implemented by said unit capacitor array comprises:

an operational amplifier having an output terminal for providing the residue voltage;

a capacitor array connected in parallel to a first input terminal of said operational amplifier;

a feedback capacitor connected in parallel to said first input terminal of said operational amplifier, for amplifying the residue voltage from a preceding stage according to the ratio of the total value of said capacitor array and the value of said feedback capacitor;

first switch means for selectively enabling said capacitor array and said feedback capacitor to receive the residue voltage from the preceding stage and a reference voltage; and second switch means for enabling transmission of said reference voltage from one of a first voltage and a second voltage in dependence upon reception of an decoded form of said digital code.

23. The pipelined multi-stage analog-to-digital converter as claimed in claim 20, wherein said multiplying digital-to-analog converter of said first stage implemented by said binary-weighted capacitor array comprises:

an operational amplifier having an output terminal for providing said residue voltage representing code errors in said first part of said digital code to a next succeeding stage;

a capacitor array connected in parallel to a first input terminal of said operational amplifier, said capacitor array comprising a most-significant-bit capacitor with a value of $2^{n-1}$ C and a least-significant-bit capacitor with a value of 1 C for accumulating charges of said analog input signal received via said sample-and-hold circuit and holding the accumulated charges of said analog input signal;

a feedback capacitor connected in parallel to said first input terminal of said operational amplifier, for amplifying said first conversion residue signal according to the ratio of the total value of said capacitor array and the value of said feedback capacitor;

first switch means for selectively enabling said capacitor array and said feedback capacitor to receive said analog input signal received via said sample-and-hold circuit and a reference voltage; and second switch means for enabling transmission of said reference voltage from one of a first voltage and a second voltage in dependence upon reception of an encoded form of said digital code.

24. The pipelined multi-stage analog-to-digital converter as claimed in claim 19, wherein said calibration means comprises:

calibration control means for calibrating each code error in the first part of said digital code and controlling the timing of a calibration sequence;

average logic means for averaging all code errors in the first part of said digital code via said digital correction means and providing averaged code errors; and memory means for storing the averaged code errors to be subtracted by said digital subtractor means from an uncalibrated digital output representative of said corrected pipelined digital code to provide said digital output code.

25. The pipelined multi-stage analog-to-digital converter as claimed in claim 24, wherein said multiplying digital-to-analog converter of said first stage of the pipeline is implemented by a binary-weighted capacitor array, and said multiplying digital-to-analog converter of succeeding stages of the pipeline is implemented by a unit capacitor array.

26. The pipelined multi-stage analog-to-digital converter as claimed in claim 19, wherein said flash analog-to-digital converter in each stage of the pipeline is a 4-bit converter.

27. The pipelined multi-stage analog-to-digital converter as claimed in claim 19, wherein said multiplying digital-to-analog converters in the first and intermediate stage of the pipeline is a 4-bit converter.

\* \* \* \* \*